United States Patent
Economou et al.

(10) Patent No.: US 7,638,759 B2
(45) Date of Patent: Dec. 29, 2009

(54) HYPERTHERMAL NEUTRAL BEAM SOURCE AND METHOD OF OPERATING

(75) Inventors: Demetre J. Economou, Houston, TX (US); Lee Chen, Cedar Creek, TX (US); Vincent M. Donnelly, Houston, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/032,865

(22) Filed: Feb. 18, 2008

(65) Prior Publication Data
US 2008/0135742 A1    Jun. 12, 2008

Related U.S. Application Data

(62) Division of application No. 11/238,191, filed on Sep. 29, 2005, now Pat. No. 7,358,484.

(51) Int. Cl.
*H05H 3/00*    (2006.01)

(52) U.S. Cl. .............. 250/251; 250/492.1; 315/111.81; 315/500; 118/723 I; 118/723 IR; 118/723 E; 118/723 ER (58) Field of Classification Search ............. 250/251, 250/492.1; 315/111.81, 500; 118/723 I, 118/723 IR, 723 E, 723 ER
See application file for complete search history.

(56) References Cited

U.S. PATENT DOCUMENTS

| | | | |
|---|---|---|---|
| 4,785,188 A | 11/1988 | Mori et al. | |
| 5,111,042 A | 5/1992 | Sullivan et al. | |
| 5,468,955 A * | 11/1995 | Chen et al. | 250/251 |
| 5,518,572 A * | 5/1996 | Kinoshita et al. | 156/345.34 |
| 5,818,040 A | 10/1998 | Kinoshita et al. | |
| 6,162,323 A * | 12/2000 | Koshimizu | 156/345.26 |
| 6,190,732 B1 | 2/2001 | Omstead et al. | |
| 6,331,701 B1 | 12/2001 | Chen et al. | |
| 6,861,643 B2 | 3/2005 | Ichiki et al. | |
| 6,909,086 B2 | 6/2005 | Samukawa et al. | |
| 6,933,495 B1 | 8/2005 | Yeom et al. | |
| 2003/0070913 A1 | 4/2003 | Miller et al. | |
| 2003/0141831 A1* | 7/2003 | Chen | 315/500 |
| 2003/0213922 A1* | 11/2003 | Gordon et al. | 250/492.1 |
| 2004/0119006 A1* | 6/2004 | Samukawa et al. | 250/251 |
| 2004/0149218 A1* | 8/2004 | Collins et al. | 118/723 I |
| 2004/0244687 A1 | 12/2004 | Ichiki et al. | |
| 2006/0288934 A1* | 12/2006 | Takahashi et al. | 118/715 |
| 2007/0084991 A1* | 4/2007 | Lee et al. | 250/251 |

FOREIGN PATENT DOCUMENTS

| | | |
|---|---|---|
| EP | 0488393 A2 | 3/1992 |
| WO | 2004/036611 A2 | 4/2004 |

\* cited by examiner

*Primary Examiner*—David A Vanore
*Assistant Examiner*—Michael Maskell
(74) *Attorney, Agent, or Firm*—Wood, Herron & Evans, L.L.P.

(57) ABSTRACT

Method and system for pumping a hyperthermal neutral beam source is described. The pumping system enables use of the hyperthermal neutral beam source for semiconductor processing applications, such as etching processes. An embodiment is described having a neutral beam source coupled to a processing chamber through a neutralizing grid. Control is provided by separately pumping the neutral beam source and the processing chamber.

18 Claims, 5 Drawing Sheets

HYPERTHERMAL NEUTRAL BEAM SOURCE AND METHOD OF OPERATING

This application is a Divisional of U.S. patent application Ser. No. 11/238,191, filed on Sep. 29, 2005, the entirety of which is incorporated herein by reference.

FIELD OF THE INVENTION

The present invention relates to a method and system for operating a neutral beam source for treating a substrate and, more particularly, to a method and system for pumping a processing system utilizing a neutral beam source.

BACKGROUND OF THE INVENTION

During semiconductor processing, plasma is often utilized to assist etch processes by facilitating the anisotropic removal of material along fine lines or within vias or on contacts patterned on a semiconductor substrate. Furthermore, plasma is utilized to enhance the deposition of thin films by providing improved mobility of adatoms on a semiconductor substrate.

For example, during dry plasma etching, a semiconductor substrate having an overlying patterned, protective layer, such as a photoresist layer, is positioned on a substrate holder in a plasma processing system. Once the substrate is positioned within the chamber, an ionizable, dissociative gas mixture is introduced, whereby the chemical composition is specially chosen for the specific material being etched on the semiconductor substrate. As the gas is introduced, excess gases are evacuated from the plasma processing system using a vacuum pump.

Thereafter, plasma is formed when a fraction of the gas species present is ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma.

The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

However, the use of plasma (i.e., electrically charged particles), itself, produces problems in the manufacture of semiconductor devices. As devices have become smaller and integration densities have increased, breakdown voltages of insulation and isolation structures therein have, in many instances, been markedly reduced, often to much less than ten volts. For example, some integrated circuit (IC) device designs call for insulators of sub-micron thicknesses.

At the same time, the reduction of the size of structures reduces the capacitance value of the insulation or isolation structures, and relatively fewer charged particles are required to develop an electric field of sufficient strength to break down insulation or isolation structures. Therefore, the tolerance of semiconductor structures for the charge carried by particles impinging on them during the manufacturing process, such as a dry plasma etching process, has become quite limited and the structures for dissipating such charges during manufacture are sometimes required, often complicating the design of the semiconductor device.

While this problem could be avoided by performing processing with neutrally charged particles, the charge of an ion or electron is the only property by which the motion of these particles can be effectively manipulated and guided. Therefore, an ion must remain in a charged state until its trajectory can be established and the energy of the ion must be sufficient that its trajectory will remain unchanged when neutralized by an electron. Even then, the trajectory may be altered and the flux of a neutral beam can be severely depleted by collisions with other particles which may or may not have been neutralized and which may have trajectories which are not precisely parallel.

As a result of this need, neutral beam sources have been developed to produce a beam of neutrally charged particles of arbitrary energy which may be as low as a few electron volts and as large as tens of thousands of electron volts or larger. Additional details for a hyperthermal neutral beam source of this caliber is provided in U.S. Pat. No. 5,468,955, entitled "Neutral Beam Apparatus for In-Situ Production of Reactants and Kinetic Energy Transfer"; the entire content of which is incorporated herein in its entirety.

SUMMARY OF THE INVENTION

The present invention relates to a method and system for operating a neutral beam source for treating a substrate and, more particularly, to a method and system for pumping a processing system utilizing a neutral beam source.

According to an embodiment, a processing system configured to treat a substrate is presented, comprising: a neutral beam source configured to produce a neutral beam by heating a process gas using plasma, wherein the neutral beam source comprises a plasma generation system configured to generate the plasma from the process gas in a plasma space within the neutral beam source, a process gas supply system configured to introduce the process gas to the neutral beam source, and a neutralizer grid coupled to an outlet of the neutral beam source and configured to neutralize a flow of plasma through the neutralizer grid in order to form the neutral beam; a processing chamber coupled to the neutral beam source and configured to receive the neutral beam in a processing space, wherein the processing chamber comprises a substrate holder configured to support the substrate and position the substrate for treatment by the neutral beam; and a vacuum pumping system coupled to the processing chamber and configured to pump the processing space in the processing chamber, and coupled to the neutral beam source and configured to pump the plasma space in the neutral beam source.

According to another embodiment, a method for treating a substrate with a neutral beam is presented, comprising: disposing the substrate in a processing chamber configured to treat the substrate with the neutral beam; forming the neutral beam using a neutral beam source coupled to the processing chamber; pumping the neutral beam source using a vacuum pumping system coupled to the neutral beam source; pumping the processing chamber using the vacuum pumping source coupled to the processing chamber; and exposing the substrate to the neutral beam.

According to other embodiments of the invention, a vacuum pumping system is coupled to said processing space and to said plasma space and operated to adjust the pumping speed from either or both of said processing space or said plasma space.

The features of the invention maintain the directionality of the processing beam while avoiding the disadvantages presented by charged plasma particles at the substrate.

DETAILED DESCRIPTION OF SEVERAL EMBODIMENTS

In the following description, to facilitate a thorough understanding of the invention and for purposes of explanation and not limitation, specific details are set forth, such as a particular geometry of the neutral beam source and the processing system and various descriptions of the system components. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

Figure 1:
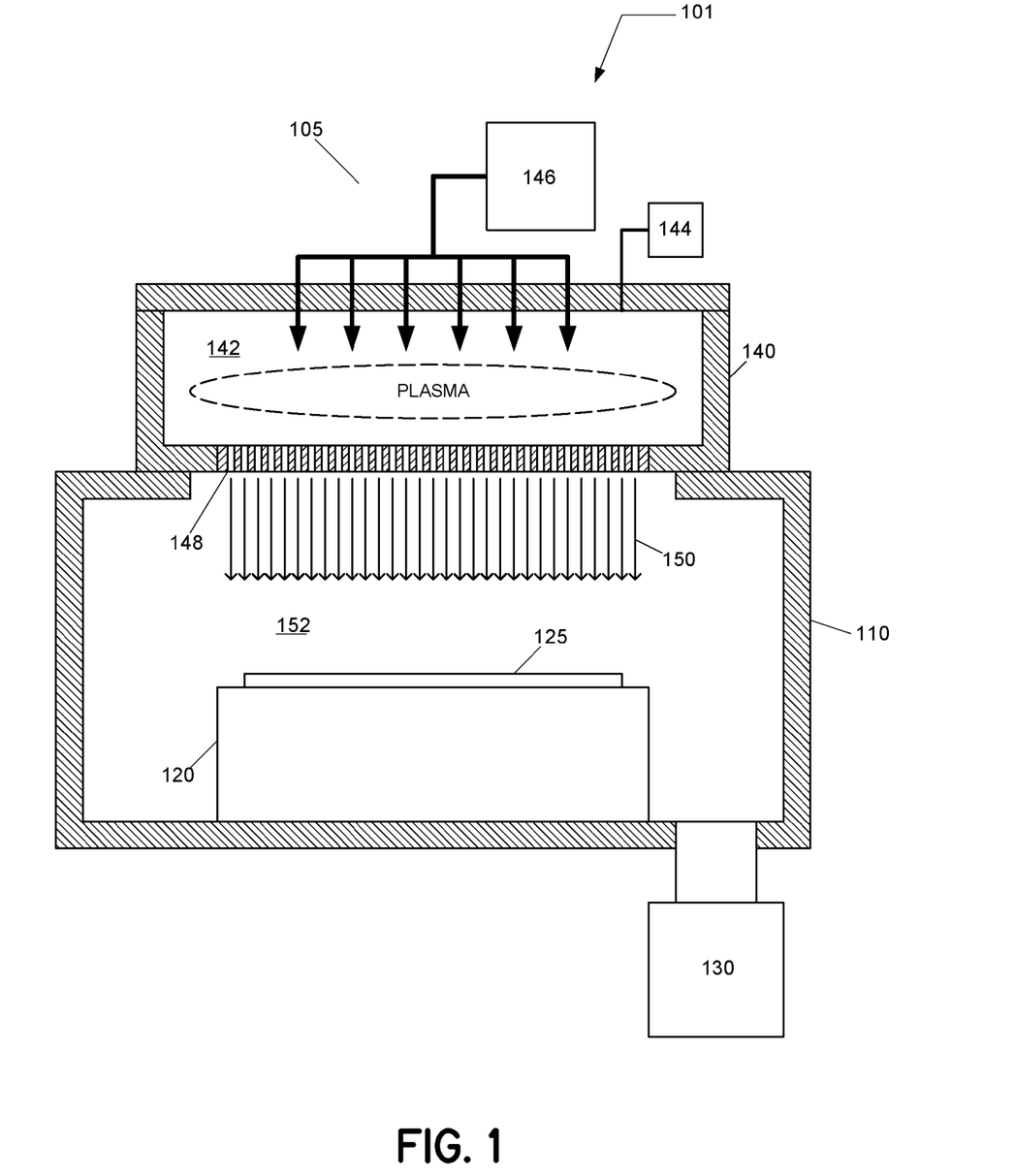
FIG. 1 shows a hyperthermal neutral beam source coupled to a processing system configured to treat a substrate.

Referring now to the drawings, wherein like reference numerals designate identical or corresponding parts throughout the several views, FIG. 1 depicts a processing system 101 comprising a neutral beam source 105 configured to produce a neutral beam, and a processing chamber 110 configured to provide a contaminant-free, vacuum environment for processing a substrate 125 with the neutral beam. The processing chamber 110 comprises a substrate holder 120 configured to support substrate 125, and a vacuum pumping system 130 coupled to the processing chamber 110 and configured to evacuate the processing chamber 110.

Referring still to FIG. 1, the neutral beam source 105 comprises a plasma generation system 140 configured to generate plasma in a plasma space 142 therein. The neutral beam source 105 further comprises a gas supply system 144 coupled to plasma generation system 140 and configured to supply an ionizable and dissociative gas mixture to the plasma generation system 140, a power source 146 coupled to plasma generation system 140 and configured to couple power to the gas mixture, and a neutralizer grid 148 coupled to plasma generation system 140 and configured to neutralize ions from the plasma and introduce a neutral beam 150 to processing space 152 above substrate 125.

The plasma generation system 140 can comprise a system configured to produce a capacitively heated plasma, an inductively heated plasma, or an electron cyclotron resonant (ECR) heated plasma, or other type of plasma understood by one skilled in the art of plasma formation.

The neutralizer grid 148 can comprise a sub-Debye neutralizer grid with high aspect ratio holes. For example, the hyperthermal neutral beam is formed through elastic forward scattering surface neutralization on the inner surfaces of the high aspect-ratio holes. Additional details for the design of a sub-Debye neutralizer grid are provided in U.S. Pat. No. 5,468,955, entitled "Neutral Beam Apparatus for In-Situ Production of Reactants and Kinetic Energy Transfer"; the entire content of which is incorporated herein in its entirety.

As the hyperthermal neutral beam diameter increases, for example, from approximately one (1) inch to approximately thirteen (13) inches (in order to process a 300 mm diameter substrate), the diameter of the neutralizer grid 148 must increase to approximately thirteen (13) inches as well. One problem associated with a large diameter neutral beam is an increased gas-load. As the diameter of the neutralizer grid 148 is increased, the total gas conductance (for the thermal gas) of the neutralizer grid increases proportionally to the open area. Of course, the conductance of the individual high aspect-ratio sub-Debye opening remains constant.

As an example, one arrangement for pumping a neutral beam source is illustrated in FIG. 1. All of the atoms/molecules (thermal and hyperthermal) pass through neutralizer grid 148, and enter processing space 152 in processing chamber 110. Vacuum pumping system 130 comprises a single turbo-molecular pump (TMP), which is coupled to processing chamber 110 in order to maximize the flow conductance between the inlet of the vacuum pump and processing space 152 (i.e., the region of substrate 125). The gas pressure of processing space 152 should be sufficiently low (e.g., <1 millitorr, mtorr) in order to prevent collisions with the gas which would cause the neutral beam to lose its directionality. For example, a desirable pressure can be approximately $1 \times 10^{-4}$ torr, or less. When the diameter of neutralizer grid 148 is approximately thirteen (13) inches, the flow conductance through the grid is approximately 100 liters/second (l/sec). In order to achieve a pressure desirable for forming plasma in plasma space 142 (i.e., 30 mtorr) and to achieve a pressure desirable for processing substrate 125 in processing space 152 (i.e., $1 \times 10^{-4}$ torr), the vacuum pumping system 130 would be required to deliver approximately 30,000 l/sec to processing space 52.

For instance, the throughput (measured as torr-l/sec) of gas passing through neutralizer grid 148 can be expressed as: $Q = C^*(P_1 - P_2)$, where Q represents the gas throughput (torr-l/sec), C represents the flow conductance through the neutralizer grid 148 (l/sec), $P_1$ represents the gas pressure (torr) in plasma space 142, and $P_2$ represents the gas pressure (torr) in processing space 152. Additionally, the throughput can be represented as $Q = P_2 S_2$, where $S_2$ represents the pumping speed delivered to the processing space 152 in order to achieve a gas pressure of $P_2$ for a throughput Q. Upon considering the conservation of mass, a steady flow requires that the two expressions for gas throughput be equivalent, hence, $P_2 S_2 = C^*(P_1 - P_2)$, or $S_2 = C^*(P_1 - P_2)/P_2$. For the conditions stated above (i.e., C~100 l/sec, $P_1$~30 mtorr, and $P_2$~0.1 mtorr), the pumping speed $S_2$ delivered to processing space 152 must be at least 30,000 l/sec (which places greater demands on the vacuum pump if the flow conductance between processing space 152 and the inlet to the vacuum pump is not substantially larger than the pumping speed at the inlet to the vacuum pump).

A 30,000 l/sec turbo-molecular pump is not readily available, and its cost will be prohibitive even if it becomes available. By comparison, for instance, when performing dry plasma etching processes on a 300 mm substrate, the size of the vacuum pump is generally 3,000 l/sec.

Figure 2A:
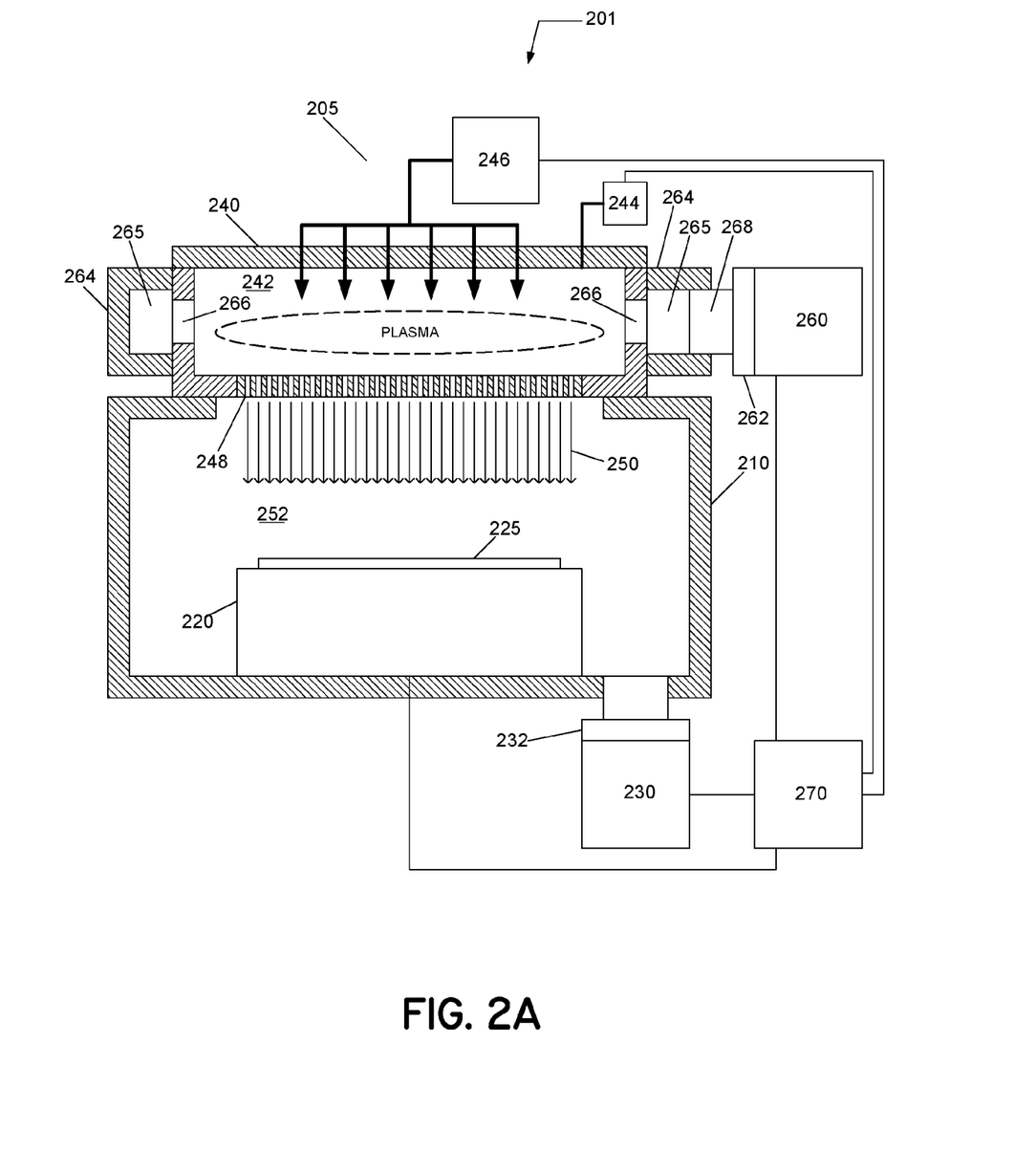
FIG. 2A presents a hyperthermal neutral beam source coupled to a processing system according to an embodiment of the invention.

Therefore, referring now to FIG. 2A wherein like reference numerals designate identical or corresponding parts throughout the several views, a processing system 201 comprising a neutral beam source 205 configured to produce a neutral beam, and a processing chamber 210 configured to provide a contaminant-free, vacuum environment for processing a substrate 225 with the neutral beam is provided according to an embodiment of the invention. The processing chamber 210 comprises a substrate holder 220 configured to support substrate 225.

Referring still to FIG. 2A, the neutral beam source 205 comprises a plasma generation system 240 configured to generate plasma in a plasma space 242 therein. The neutral beam source 205 further comprises a gas supply system 244 coupled to plasma generation system 240 and configured to supply an ionizable and dissociative gas mixture to the plasma generation system 240, a power source 246 coupled to plasma generation system 240 and configured to couple power to the gas mixture, and a neutralizer grid 248 coupled to plasma generation system 240 and configured to introduce neutral beam 250 to processing space 252 above substrate 225.

Furthermore, processing system 201 comprises a vacuum pumping system coupled to the neutral beam source 205 and configured to pump the plasma space 242 within the neutral beam source 205, and coupled to the processing chamber 210 and configured to pump the processing space 252 within the processing chamber 210. As shown in FIG. 2A, the vacuum pumping system can comprise a first vacuum pumping system 230 coupled to the processing chamber 210 and configured to evacuate the processing chamber 210. Additionally, the vacuum pumping system can comprise a second vacuum pumping system 260 coupled to the neutral beam source 205 and configured to evacuate the neutral beam source 205.

The first vacuum pumping system 230 can, for example, comprise a first vacuum pump coupled to processing space 252 through a first exhaust duct, and an optional first vacuum valve 232. The second vacuum pumping system 260 can, for example, comprise a second vacuum pump configured to access plasma space 242 through a pumping manifold 264 coupled to one or more openings 266 formed in neutral beam source 205. Exhaust gases in plasma space 242 may pass through the one or more openings 266, enter a pumping space 265, and exit through duct 268 into the second vacuum pump. The second vacuum pumping system 260 may include a second vacuum valve 262 to adjust the pumping speed delivered to plasma space 242.

Figure 2B:
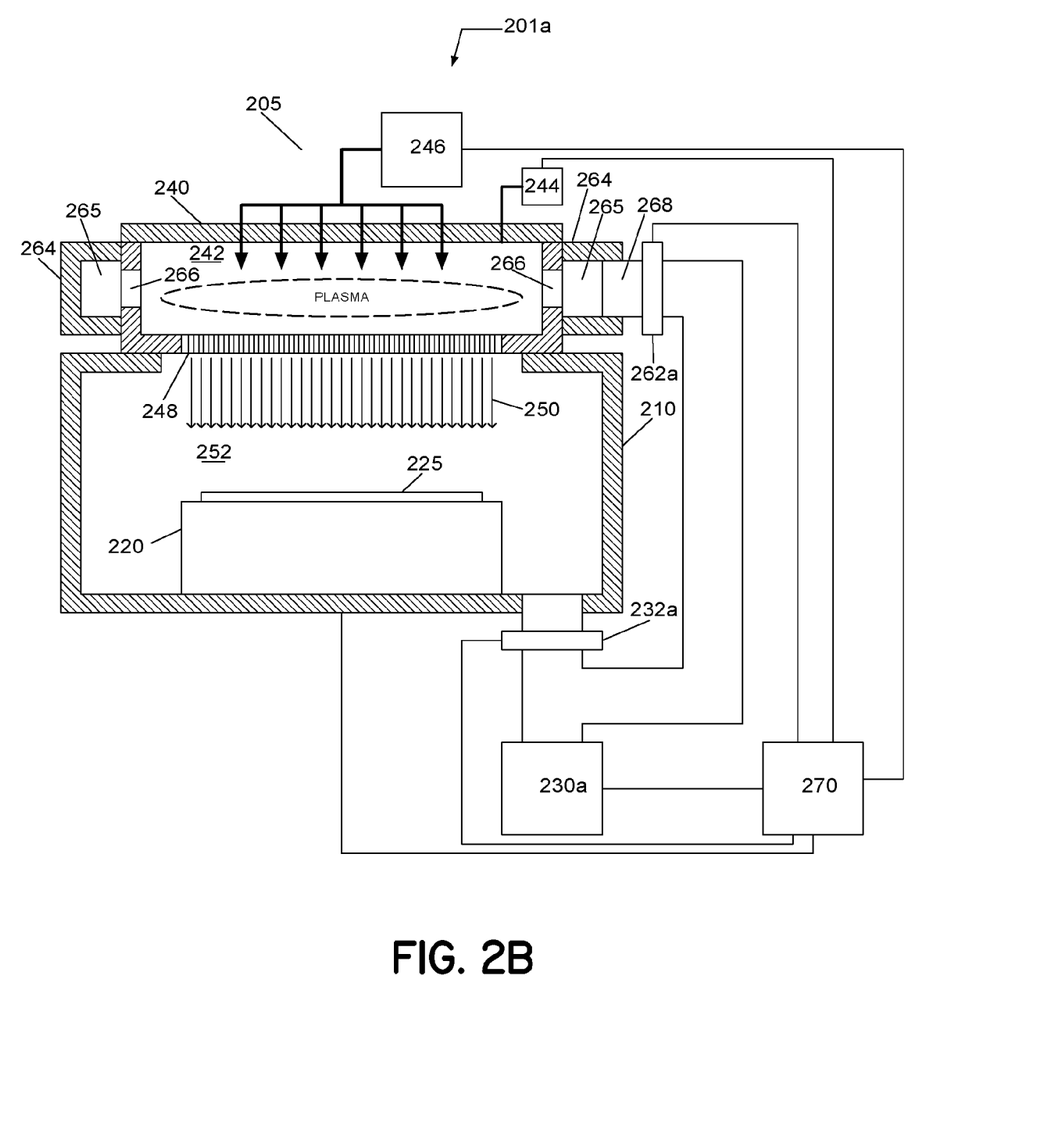
FIG. 2B presents a hyperthermal neutral beam source coupled to a processing system according to another embodiment of the invention.

Alternatively, as shown in FIG. 2B, a processing system 201a having the vacuum pumping system can comprise a single vacuum pumping system 230a coupled to the processing chamber 210 and configured to evacuate the processing chamber 210, and coupled to the neutral beam source 205 and configured to evacuate the neutral beam source 205. The vacuum pumping system 230a can, for example, comprise a vacuum pump coupled to processing space 252 through a first exhaust duct, and a first vacuum valve 232a. Additionally, the vacuum pump is coupled to plasma space 242 through a pumping manifold 264 coupled to one or more openings 266 formed in neutral beam source 205. Exhaust gases in plasma space 242 may pass through the one or more openings 266, enter a pumping space 265, and exit through duct 268' into the second vacuum pump. A second vacuum valve 262a is utilized to adjust the pumping speed delivered to plasma space 242.

In the pumping configuration depicted in FIG. 2A, vacuum pumping system 230 evacuates processing space 252 and second vacuum pumping system 260 evacuates plasma space 242. Returning now to the example provided earlier (i.e., a flow conductance of approximately C~100 l/sec for neutralizer grid 248, a gas pressure of approximately $P_1$~30 mtorr in plasma space 242, and a gas pressure of approximately $P_2$~0.1 mtorr in processing space 252), the pumping speed of vacuum pumping system 230 may, for instance, be approximately 3000 l/sec and the pumping speed of second vacuum pumping system 260 may, for instance, be approximately 1000 l/sec.

It is desirable to minimize the (thermal) gas load through the neutralizer grid 248. Therefore, for example, the pumping speed delivered directly to plasma space 242 can be selected to be approximately ten (10) times greater than the flow conductance of the neutralizer grid 248. In this example, approximately 90% of the gas flow exiting from plasma space 242 is exhausted to the second vacuum pumping system 260 while the remaining approximately 10% of the gas flow exiting from plasma space 242 is exhausted to vacuum pumping system 230. Since the gas load through the neutralizer grid 248 is reduced by approximately an order of magnitude, the requirement for the pumping speed delivered to the processing space 252 is lessened by an order of magnitude.

In continuing this example, if the pumping speed for the second vacuum pumping system 260 is selected to be approximately 1000 l/sec, then the flow conductance between the inlet of the second pumping system 260 and plasma space 242 should be sufficiently large such that the actual pumping speed delivered to plasma space 242 is substantially equivalent to the pumping speed at the inlet to the second vacuum pumping system 260. For instance, if the pumping speed at the inlet to the second vacuum pumping system 260 is $S_{inlet}$=1000 l/sec and the flow conductance (between the second vacuum pumping system and the plasma space) is $C_{plasma}$=10,000 l/sec, then the pumping speed delivered to plasma space 242 is:

$$S_{plasma}=S_{inlet}*C_{plasma}/(S_{inlet}+C_{plasma})=909\ l/sec.$$

Alternatively, for instance, if the pumping speed at the inlet to the second vacuum pumping system 260 is $S_{inlet}$=2000 l/sec and the flow conductance (between the second vacuum pumping system and the plasma space) is $C_{plasma}$=2000 l/sec, then the pumping speed delivered to plasma space 242 is:

$$S_{plasma}=S_{inlet}*C_{plasma}/(S_{inlet}+C_{plasma})=1000\ l/sec.$$

In order to provide a flow conductance of 10,000 l/sec, the height of the one or more openings 266 can, for instance, be approximately 20 cm which, for a 40 cm diameter neutral beam source, gives a flow conductance of:

$$C_{opening} \sim 10*A_{opening}(cm^2)=25,133\ l/sec,$$

and the cross-section of annular space 265 can be 50 cm by 50 cm which gives a flow conductance of:
$C_{annular} \sim 10*A_{annular}(cm^2)=25,000$, such that the total flow conductance becomes:

$$C_{TOTAL} \sim C_{annular}*C_{opening}/(C_{annular}+C_{opening})=12,533\ l/sec.$$

In yet another example, the neutral beam source can be configured to produce a divergent hyperthermal neutral beam. In a divergent hyperthermal neutral beam, the neutralizer grid flow conductance is larger than its sub-Debye counterpart. As a result, vacuum valve 232 can be utilized to adjust the pumping speed delivered to processing space 252 and, hence, adjust the thermal neutral flux through the neutralizer grid 248 to processing space 252, which can, in turn, be utilized to adjust and/or control the process chemistry at the substrate surface.

Referring still to FIG. 2A and as described above, the neutral beam source 205 comprises a plasma generation system 240 configured to generate a plasma. The plasma generation system 240 includes a power source 246 configured to couple power to the process gas. The power source 246 may be a variable power source and may include a radio frequency (RF) generator and an impedance match network, and may further include an electrode through which RF power is coupled to the plasma in neutral beam source 205. The electrode can be formed in an upper assembly of the neutral beam source 205, and it can be configured to oppose the neutralizer grid 248. The impedance match network can be configured to optimize the transfer of RF power from the RF generator to the plasma by matching the output impedance of the match network with the input impedance of the plasma generation system, including the electrode, and plasma. For instance, the impedance match network serves to improve the transfer of RF power to plasma in neutral beam source 205 by reducing the reflected power. Match network topologies (e.g. L-type, π-type, T-type, etc.) and automatic control methods are well known to those skilled in the art.

Alternatively, the power source 246 may include a radio frequency (RF) generator and an impedance match network, and may further include an antenna, such as an inductive coil, through which RF power is coupled to plasma in neutral beam source 205. The antenna can, for example, include a helical, or solenoidal coil, such as in an inductively coupled plasma source or helicon source, or it can, for example, include a planar (or flat) coil as in a transformer coupled plasma source.

Alternatively, the power source 246 may include a microwave frequency generator, and may further include a microwave antenna and microwave window through which microwave power is coupled to plasma in neutral beam source 205. The coupling of microwave power can be accomplished using electron cyclotron resonance (ECR) technology, or it may be employed using surface wave plasma technology.

Referring still to FIG. 2A and as described above, the neutral beam source 205 comprises neutralizer grid 248 configured to neutralize the flow of plasma gases therethrough and form a neutral beam. Neutralizer grid 248 comprises a plurality of openings, wherein each opening can be characterized by a length (L) (e.g., grid thickness) and a diameter (D). The term "diameter" will be used as a matter of convenience to connote the transverse dimension of any aperture of arbitrary shape in the following discussion. For example, the neutralizer grid 248 can comprise a sub-Debye neutralizer grid. Therein, each opening has a diameter less than or equal to the Debye length, which is expressed as: $\lambda_d = (k_b T_o / 4\pi \eta_e q^2)^{1/2}$, where $k_b$ is the Boltzmann's constant, $T_o$ is the temperature of the plasma, $\eta_e$ is the electron density of the plasma, and q is the charge of an electron. Furthermore, each opening has a length such that the aspect ratio of each opening (ratio of length to diameter, or L/D) is equal to or greater than unity. Under this condition, the plasma sheath proximate the entrance to each opening is substantially unaffected by the presence of the opening, i.e., the sheath remains substantially planar. Alternatively, for example, the neutralizer grid 248 can comprise a plurality of openings, wherein each opening has a diameter larger than, equal to, or smaller than a Debye length. However, each opening has a length (L) that satisfies the inequality: $L \geq D^2 / 4\lambda_d$. Under this condition, the plasma is not expected to extend beyond the bottom of each opening. Additional details for the design of a neutralizer grid are provided in U.S. Pat. No. 5,468,955, entitled "Neutral Beam Apparatus for In-Situ Production of Reactants and Kinetic Energy Transfer"; the entire content of which is incorporated herein by its entirety.

Referring still to FIG. 2A, the neutralizer grid 248 is desirably coupled to electrical ground (i.e., RF ground), as is the processing chamber 210. However, in order to enhance acceleration of ions created in plasma space 242 to the neutralizer grid 248 where they are neutralized to form the neutral beam, other portions of neutral beam source 205, including pumping manifold 264 can be electrically biased with a time varying boundary voltage $V_b(t)$. The boundary voltage can include a RF voltage at a RF frequency consistent with the power source 246 utilized in the plasma generation system 240. When an electrical bias is utilized, the plasma potential $V_p(t)$ for plasma in plasma space 242 is raised to a value greater than its natural potential. Therein, the plasma potential follows the positive phase of the boundary voltage $V_b(t)$ and remains a positive voltage (near zero volts) during the negative phase of the boundary voltage.

During electrical biasing, ions in the plasma are subjected to a voltage gradient between the plasma potential and the voltage of the neutralizer grid, i.e., $V_p(t) - V_{grid}$ (e.g., $V_{grid} \sim 0$ volts), causing ion acceleration to the neutralizer grid 348 where the ions are neutralized to form the neutral beam. Therefore, the pumping manifold 264 is electrically isolated from ground with a sufficiently high RF impedance. Furthermore, second vacuum pumping system 260 is electrically coupled to the pumping manifold 264, wherein the electrical connection is either a DC (direct current) coupling or a RF reactive coupling with a low RF impedance (such as a low capacitance coupling). Consequently, the second vacuum pumping system 260 is electrically isolated from the foreline (or outlet vacuum plumbing). At the outlet to the second vacuum pumping system 260, plasma entering the vacuum pump is neutralized and it is exhausted to an electrically grounded roughing pump (as is standard in conventional vacuum systems). The neutralization of plasma entering the second vacuum pumping system occurs when the rotor and stator blade rows act as neutralizing surfaces for the incident plasma. Alternatively, the second vacuum pumping system 260 can be coupled to RF ground. However, if so, a neutralization device should be utilized to neutralize plasma entering the second vacuum pumping system 260 in order to prevent damage (i.e., sputtering) of the interior of the vacuum pump.

Vacuum pumping system 230 and second vacuum pumping system 260 can, for example, include a turbo-molecular vacuum pump (TMP) capable of a pumping speed up to 5000 liters per second (and greater) and a vacuum valve (or second vacuum valve), such as a gate valve, for throttling the pressure in processing space 252 (or plasma space 242). Furthermore, a device for monitoring chamber pressure (not shown) can be coupled to the processing chamber 210. The pressure measuring device can be, for example, a Type 628B Baratron absolute capacitance manometer commercially available from MKS Instruments, Inc. (Andover, Mass.).

Still referring to FIG. 2A, processing system 201 can comprise a substrate temperature control system coupled to the substrate holder 220 and configured to adjust and control the temperature of substrate 225. The substrate temperature control system comprises temperature control elements, such as a cooling system including a re-circulating coolant flow that receives heat from substrate holder 220 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 220, as well as the chamber wall of the processing chamber 210 and any other component within the processing system 201.

In order to improve the thermal transfer between substrate 225 and substrate holder 220, substrate holder 220 can include a mechanical clamping system, or an electrical clamping system, such as an electrostatic clamping system, to affix substrate 225 to an upper surface of substrate holder 220.

Furthermore, substrate holder 220 can further include a substrate backside gas delivery system configured to introduce gas to the back-side of substrate 225 in order to improve the gas-gap thermal conductance between substrate 225 and substrate holder 220. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 225.

Referring still to FIG. 2A, processing system 201 can further comprise a controller 270. Controller 270 comprises a microprocessor, memory, and a digital I/O port capable of generating control voltages sufficient to communicate and activate inputs to processing system 201 as well as monitor outputs from processing system 201. Moreover, controller 270 can be coupled to and can exchange information with neutral beam source 205 including gas supply system 244, power source 246 and neutralizer grid 248, substrate holder 220, first vacuum pumping system 230, and second vacuum pumping system 260. For example, a program stored in the memory can be utilized to activate the inputs to the aforementioned components of processing system 201 according to a process recipe in order to perform the method of treating substrate 225. One example of controller 270 is a DELL PRECISION WORKSTATION 610™, available from Dell Corporation, Austin, Tex.

However, the controller 270 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 270 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 270, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 270 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 270.

Controller 270 may be locally located relative to the processing system 201, or it may be remotely located relative to the processing system 201 via an internet or intranet. Thus, controller 270 can exchange data with the processing system 201 using at least one of a direct connection, an intranet, or the internet. Controller 270 may be coupled to an intranet at a customer site (i.e., a device maker, etc.), or coupled to an intranet at a vendor site (i.e., an equipment manufacturer). Furthermore, another computer (i.e., controller, server, etc.) can access controller 270 to exchange data via at least one of a direct connection, an intranet, or the internet.

Figure 3:
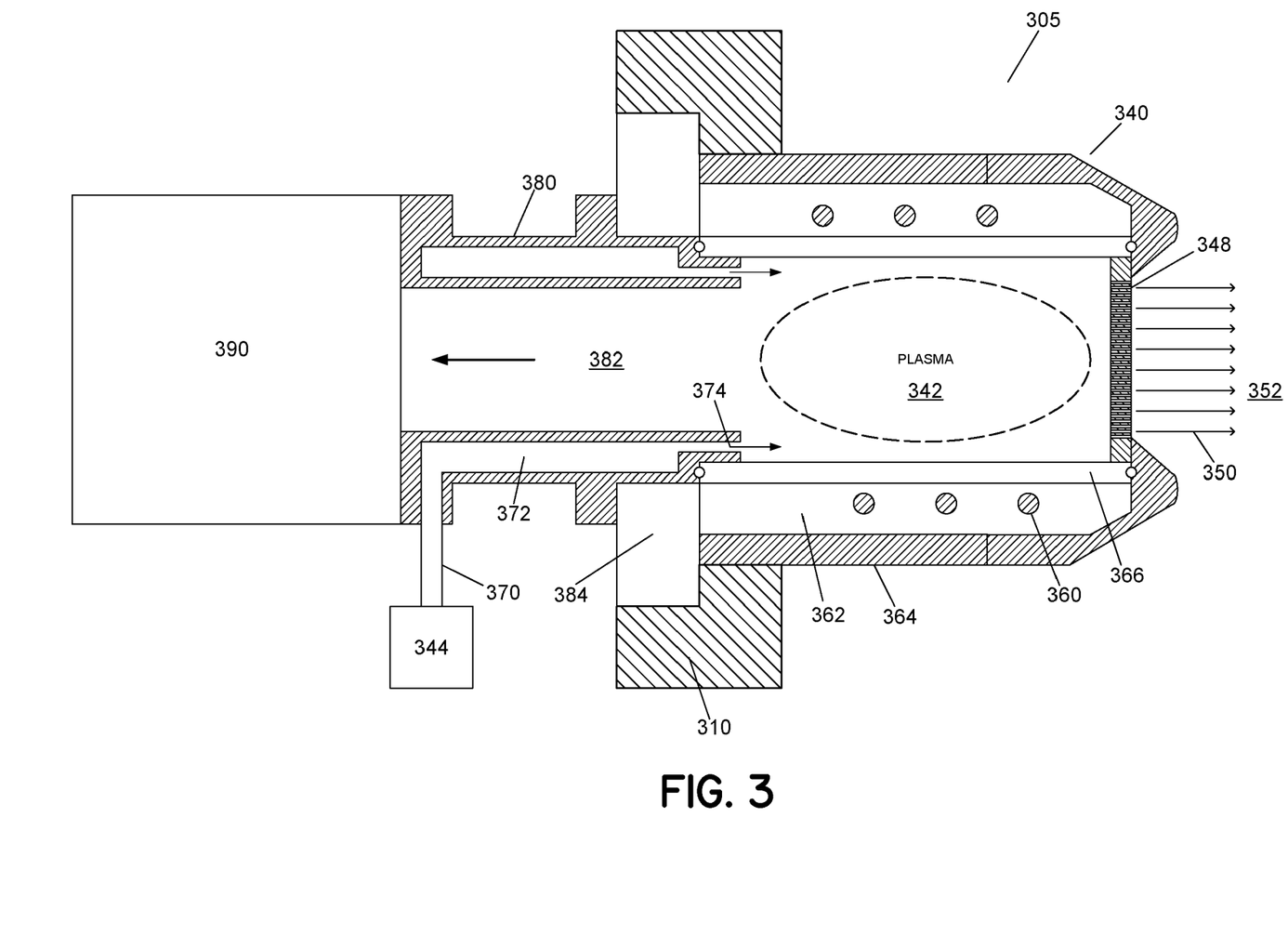
FIG. 3 presents a hyperthermal neutral beam source coupled to a processing system according to another embodiment of the invention.

Referring now to FIG. 3, wherein like reference numerals designate identical or corresponding parts throughout the several views, a neutral beam source 305 configured to produce a hyperthermal neutral beam, and configured to couple with a processing chamber 310 is provided according to an embodiment of the invention.

Referring still to FIG. 3, the neutral beam source 305 comprises a plasma generation system 340 configured to generate plasma in a plasma space 342 therein. The neutral beam source 305 further comprises a gas supply system 344 coupled to plasma generation system 340 and configured to supply an ionizable and dissociative gas mixture to the plasma generation system 340, a power source (not shown) coupled to plasma generation system 340 and configured to couple power to the gas mixture, and a neutralizer grid 348 coupled to plasma generation system 340 and configured to introduce neutral beam 350 to a processing space 352.

The power source may be a variable power source and may include a radio frequency (RF) generator and an impedance match network. For example, the RF frequency can be 13.56 MHz.

As illustrated in FIG. 3, plasma generation system 340 can comprise a helical coil 360 configured to inductively couple electrical power to plasma in plasma space 342. The plasma generation system 340 comprises an inductive coil cavity 362 formed by a plasma source housing 364 and process tube 366, within which helical coil 360 is contained. Helical coil 360 encircles process tube 366, and inductively couples power through process tube 366 into plasma space 342. The process tube 366 can, for example, comprise a dielectric material, such as quartz or alumina. Additionally, plasma source housing 364 can be fabricated from aluminum, and it can be coupled to electrical ground. Furthermore, a cooling fluid may be introduced to inductive coil cavity 362 in order to remove heat from power dissipation.

The inductive coil 360 can include a first end coupled directly to electrical ground, or indirectly to electrical ground through, for instance, a capacitor. Additionally, inductive coil 360 can include a second end coupled to the source of power, or it may be an open end. In the latter, a tap location is positioned between the first and second ends for the coupling of power. For example, the inductive coil 360 may be designed as a quarter-wave or half-wave resonator.

Referring still to FIG. 3, an evacuation housing 380 is coupled to the plasma generation system 340 and is configured to receive plasma gases and provide access to vacuum pumping system 390 through exhaust duct 382. An insulation ring 384 is positioned between the plasma generation system 340 and the evacuation housing 380, and between the processing chamber 310 and the evacuation housing 380. The evacuation housing 380 may further serve as an accelerator in order to accelerate ions formed in the plasma towards the neutralizer grid 348, whereby the evacuation housing 380 is electrically biased with a voltage $V_b(t)$. The boundary voltage can include a RF voltage at a RF frequency consistent with the power source utilized in the plasma generation system 340. When an electrical bias is utilized the plasma potential $V_p(t)$ is raised to a value greater than its natural potential. Therein, the plasma potential follows the positive phase of the boundary voltage $V_b(t)$ and remains a positive voltage (near zero volts) during the negative phase of the boundary voltage. During electrical biasing, ions in the plasma are subjected to a voltage gradient between the plasma potential and the voltage of the neutralizer grid, i.e., $V_p(t)-V_{grid}$ (e.g., 0 volts), causing ion acceleration to the neutralizer grid 348 where the ions are neutralized to form the neutral beam.

When the evacuation housing 380 is electrically biased, the vacuum pumping system 390 can be electrically floating (from ground) and can be electrically coupled to the evacuation housing 380. Therefore, vacuum pumping system 390 can be coupled directly to evacuation housing 380; however, the vacuum pumping system 390 must be electrically insulated from the foreline (or outlet vacuum plumbing).

Furthermore, as illustrated in FIG. 3, process gas is introduced to plasma space 342 from gas supply system 344 through an evacuation housing 380. Gas supply system 344 comprises a gas supply line 370 coupled to an annular gas plenum 372 that distributes process gas to a plurality of injection nozzles 374.

Figure 4:
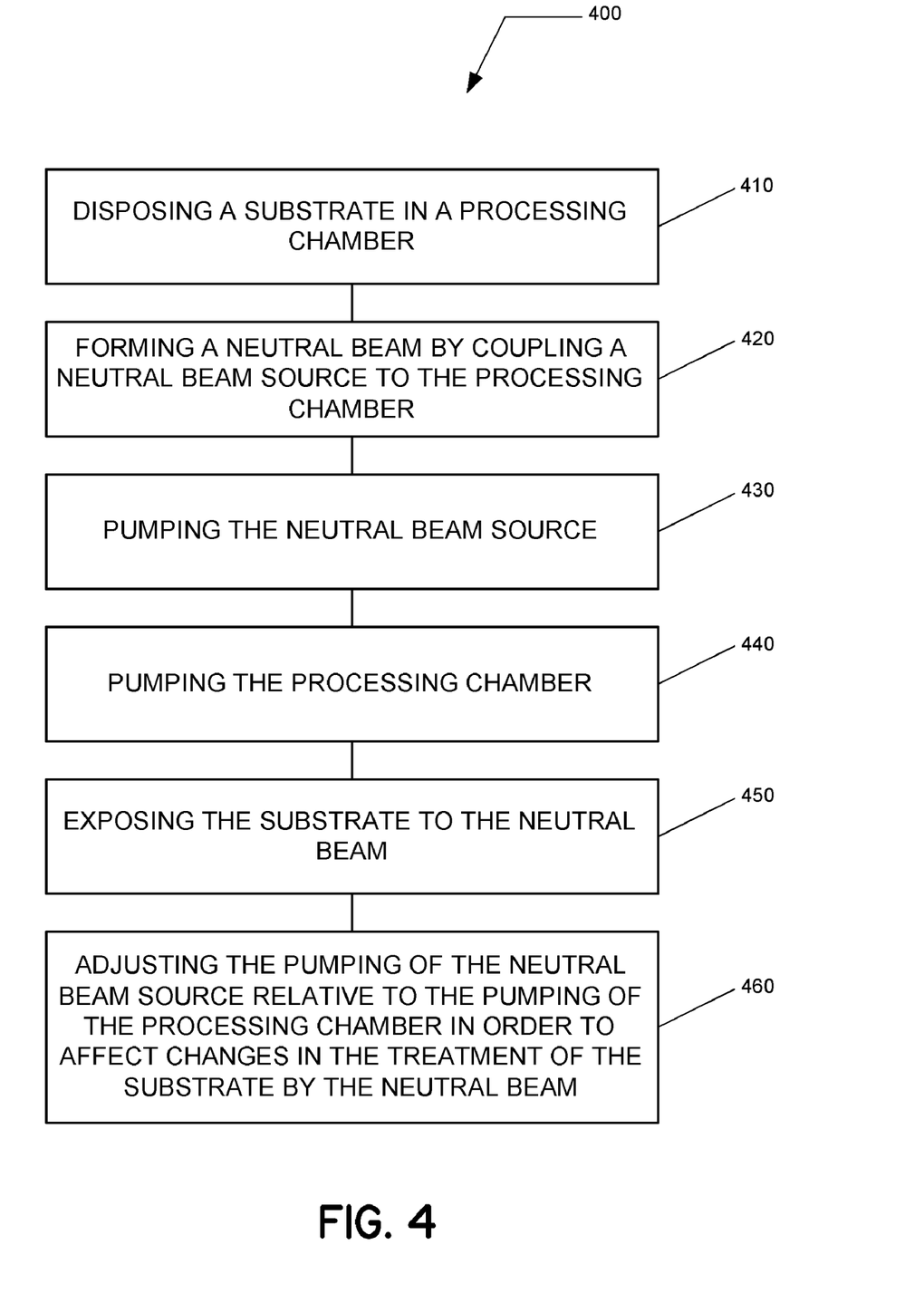
FIG. 4 illustrates a method of operating a neutral beam source coupled to a processing system configured to treat a substrate according to yet another embodiment of the invention.

Referring now to FIG. 4, a flow chart 400 of a method for operating a processing system utilizing a neutral beam source to treat a substrate is illustrated according to an embodiment of the invention. Flow chart 400 begins in 410 with disposing a substrate in a processing chamber configured to facilitate the treatment of the substrate using a neutral beam.

In 420, a neutral beam is formed using a neutral beam source coupled to the processing chamber. The neutral beam can be provided using a neutral beam source as described in FIGS. 1 through 3.

In 430, a fraction of the gaseous medium in the neutral beam source is pumped by a vacuum pumping system. In 440, gases entering the processing chamber from the neutral beam source are pumped by another vacuum pumping system. The vacuum pumping system utilized to pump the neutral beam source and the other vacuum pumping system utilized to pump the processing chamber may utilize the same vacuum pump, or they may utilize independent vacuum pumps.

In 450, the substrate is exposed to the neutral beam that exits the neutral beam source and enters the processing chamber in order to treat the substrate. In 460, the pumping speed delivered to the neutral beam source is adjusted relative to the pumping speed delivered to the processing chamber in order to affect changes in the treatment of the substrate. For example, the pumping speed delivered to the neutral beam source can be reduced relative to the pumping speed delivered to the processing chamber in order to affect an increase in the neutral flux to the substrate. Conversely, the pumping speed delivered to the neutral beam source can be increased relative to the pumping speed delivered to the processing chamber in order to affect a reduction in the neutral flux to the substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for treating a substrate with a neutral beam, comprising:
    disposing said substrate in a processing chamber configured to treat said substrate with said neutral beam;
    forming said neutral beam using a neutral beam source coupled to said processing chamber;
    pumping said neutral beam source using a vacuum pumping system coupled to said neutral beam source;
    pumping said processing chamber using said vacuum pumping system coupled to said processing chamber;
    exposing said substrate to said neutral beam; and
    controlling a neutral flux of said neutral beam to affect changes in a treatment of said substrate during said exposing by varying at least one of: a pumping speed of said neutral beam source, or a pumping speed of said processing chamber, or a combination thereof.

2. The method of claim 1, further comprising:
    adjusting the pumping of the neutral beam source relative to the pumping of the processing chamber in order to affect a change in the treatment of the substrate using the neutral beam.

3. The method of claim 1, further comprising:
    adjusting a first vacuum valve to adjust the pumping speed of the processing chamber and adjusting a second vacuum valve to adjust the pumping speed of the neutral beam source.

4. The method of claim 1, wherein:
    the vacuum pumping system comprises at least one vacuum pump coupled to the processing chamber and to the neutral beam space; and
    adjusting the coupling to adjust the pumping speed of either or both of the processing chamber or the neutral beam source.

5. The method of claim 1, further comprising:
    maintaining a pressure differential between the neutral beam source and the processing chamber.

6. The method of claim 1, further comprising:
    pumping the processing chamber at a pumping speed of approximately 5000liters per second or less and pumping the neutral beam source at a pumping speed of approximately 5000 liters per second or less.

7. The method of claim 1, further comprising:
    exhausting gases from the processing chamber through one or more openings in the neutral beam source and through a pumping manifold to the vacuum pumping system.

8. The method of claim 1, further comprising:
    exhausting gases from the processing chamber to the vacuum pumping system through one or more openings in the neutral beam source and through a pumping manifold that surrounds a periphery of said neutral beam source.

9. The method of claim 8 wherein the pumping manifold provides a flow conductance equal to or greater than approximately 5000 liters per second.

10. The method of claim 8 wherein the pumping manifold provides a flow conductance equal to or greater than approximately 10,000 liters per second.

11. The method of claim 8 wherein the pumping manifold provides a flow conductance equal to or greater than approximately 20,000 liters per second.

12. The method of claim 1, further comprising:
controlling the neutral beam by varying at least one of: a power coupled to said neutral beam source, a process gas composition coupled to said neutral beam source, a temperature of said substrate, or a combination thereof.

13. The method of claim 1, wherein:
the forming of the neutral beam includes heating a process gas by generating a plasma from process gas in a processing space within the neutral beam source, introducing process gas to the neutral beam source, and neutralizing a flow of plasma through a neutralizer grid.

14. The method of claim 13, further comprising:
electrically biasing said neutralizer grid.

15. The method of claim 13, further comprising:
disposing an evacuation housing between said neutral beam source and said vacuum pumping system; and
electrically biasing said evacuation housing.

16. The method of claim 13, further comprising:
electrically biasing a portion of said neutral beam source that acts as a surrounding boundary in contact with said plasma.

17. The method of claim 13, further comprising:
elevating a plasma potential of said plasma.

18. A method for treating a substrate with a neutral beam, comprising:
disposing said substrate in a processing chamber configured to treat said substrate with said neutral beam;
forming said neutral beam using a neutral beam source coupled to said processing chamber;
pumping said neutral beam source using a vacuum pumping system coupled to said neutral beam source;
pumping said processing chamber using said vacuum pumping system coupled to said processing chamber;
exposing said substrate to said neutral beam; and
controlling a neutral flux of said neutral beam to affect changes in a treatment of said substrate during said exposing by varying a process gas composition coupled to said neutral beam source.

* * * * *